United States Patent [19]
Tantoush

[11] Patent Number: 5,847,452
[45] Date of Patent: Dec. 8, 1998

[54] POST MOUNTED HEAT SINK METHOD AND APPARATUS

[75] Inventor: Mohammad A. Tantoush, Fremont, Calif.

[73] Assignee: Sun Microsystems, Inc., Mountain View, Calif.

[21] Appl. No.: 886,773

[22] Filed: Jul. 1, 1997

[51] Int. Cl.⁶ .......................... H01L 23/34; H01L 23/12; H05K 7/20
[52] U.S. Cl. .......................... 257/722; 257/731; 257/726; 257/727; 361/703; 361/709
[58] Field of Search .................. 257/722, 727, 257/675, 730–733, 718, 719, 720, 726; 361/702, 703, 709; 174/252

[56] References Cited

U.S. PATENT DOCUMENTS

| | | | |
|---|---|---|---|
| 5,055,909 | 10/1991 | Culver | 257/722 |
| 5,615,735 | 4/1997 | Yoshida et al. | 257/727 |

Primary Examiner—Mahshid D. Saadat
Assistant Examiner—Jhihan B. Clark
Attorney, Agent, or Firm—Blakely Sokoloff Taylor & Zafman

[57] ABSTRACT

Heat sinks and methods particularly suited for use on packaged integrated circuits which are not amenable to the use of snap-on heat sinks and on which cemented-on heat sinks prevent conventional probing or reworking of the integrated circuit in the event trouble-shooting of the circuit is required after mounting of the heat sink. In accordance with the invention, a scalable post, based on heat sink size, mass and integrated circuit size, is cemented to the integrated circuit package in a configuration and location not interfering with the later probing or reworking of the integrated circuit, and without interfering with the printed circuit board layout. The post is then used to removably and independently hold a heat sink onto the integrated circuit so that good heat transfer between the integrated circuit and the heat sink is achieved, but still allowing the removal of the heat sink at any time if probing of the integrated circuit is later required. Alternate embodiments are disclosed.

14 Claims, 2 Drawing Sheets

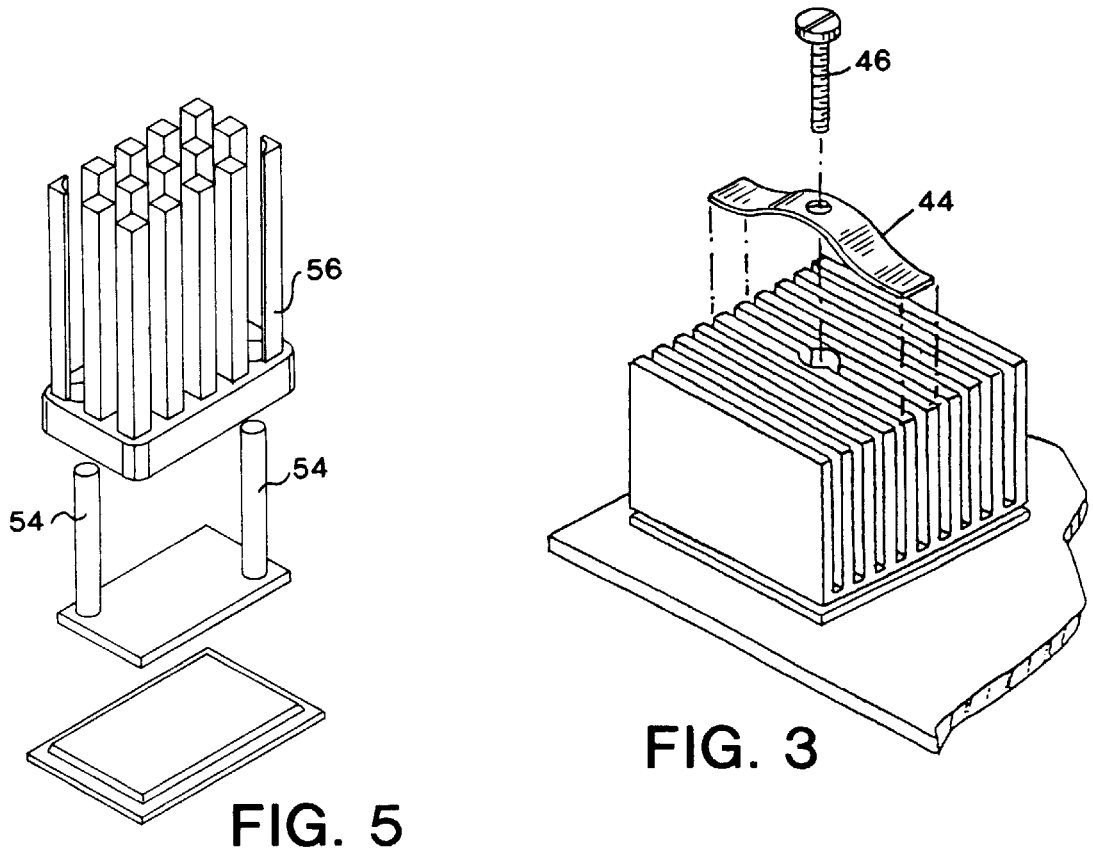
FIG. 5
FIG. 3
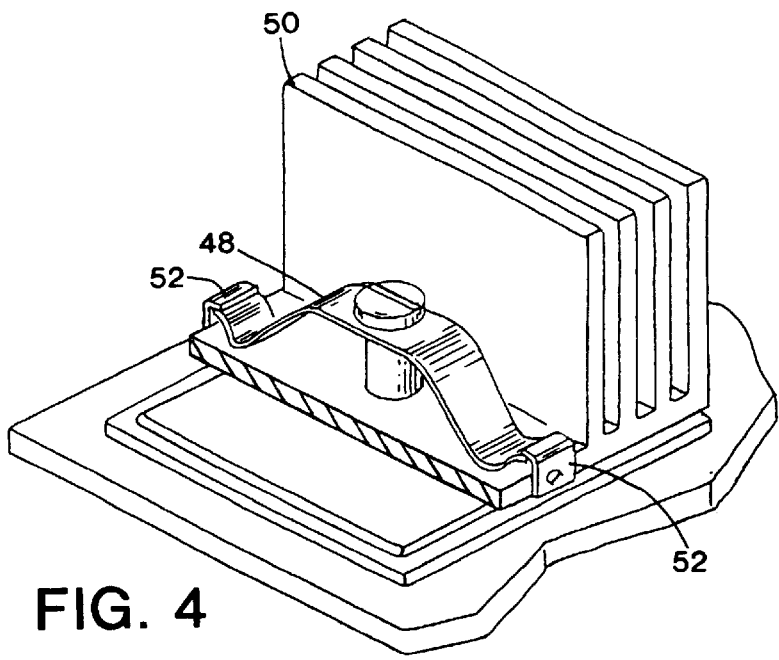
FIG. 4

POST MOUNTED HEAT SINK METHOD AND APPARATUS

BACKGROUND OF THE INVENTION

1. Field of the Invention

The present invention relates to the field of heat sinks for semiconductor devices and integrated circuits.

2. Prior Art

Various configurations of heat sinks for semiconductor devices and integrated circuits are well known in the prior art. One common type of heat sink for mounting on the integrated circuit or other semiconductor device comprises a heat sink having projecting fins or legs to increase the surface area of the heat sink for heat dissipation to the surrounding area, either through free convection or forced convection (fan driven) cooling.

In some cases, heat sinks have been configured to somehow snap onto the integrated circuit or other semiconductor device. In such circumstances, the thermal contact between the integrated circuit and the heat sink can be substantially limited, as the actual area of contact between the integrated circuit and the heat sink can be only a small fraction of a potential area for such contact. In such cases, the heat transfer from the integrated circuit to the heat sink may be increased through the use of a thermally conductive grease spanning the air spaces between the heat sink and the packaged integrated circuit. In other cases, the heat sinks have been cemented to the packaged integrated circuits, providing both the mounting and the substantial absence of air spaces between the packaged integrated circuits and the heat sinks.

In the case of snap-on heat sinks, such heat sinks are readily removable to provide access to the integrated circuit pins and board traces for probing purposes, but such heat sink designs are not readily adaptable to certain integrated circuit packages, such as ball grid array integrated circuit packages. In the case of cement-on heat sinks, such heat sinks are readily adaptable to a wide variety of integrated circuit packages, including but not limited to ball grid array packages, but generally prevent reworking or probing of the integrated circuit pins and associated circuit traces in the event that board trouble shooting is required after the heat sink has been mounted.

SUMMARY OF THE INVENTION

Heat sinks and methods particularly suited for use on packaged integrated circuits which are not amenable to the use of snap-on heat sinks and on which cemented-on heat sinks prevent conventional probing or reworking of the integrated circuit in the event trouble-shooting of the circuit is required after mounting of the heat sink. In accordance with the invention, a scalable post, based on heat sink size, mass and integrated circuit size, is cemented to the integrated circuit package in a configuration and location not interfering with the later probing or reworking of the integrated circuit, and without interfering with the printed circuit board layout. The post is then used to removably and independently hold a heat sink onto the integrated circuit so that good heat transfer between the integrated circuit and the heat sink is achieved, but still allowing the removal of the heat sink at any time if probing of the integrated circuit is later required. Alternate embodiments are disclosed.

BRIEF DESCRIPTION OF THE FIGURES

FIG. 3 is a perspective view of an alternate embodiment using a spring hold-down mechanism.

FIG. 4 is a perspective view of a still further alternate embodiment using a spring hold-down mechanism of a lower profile.

FIG. 5 is a perspective view of a further alternate embodiment using a double post structure.

DETAILED DESCRIPTION OF THE PRESENT INVENTION

Figure 1:
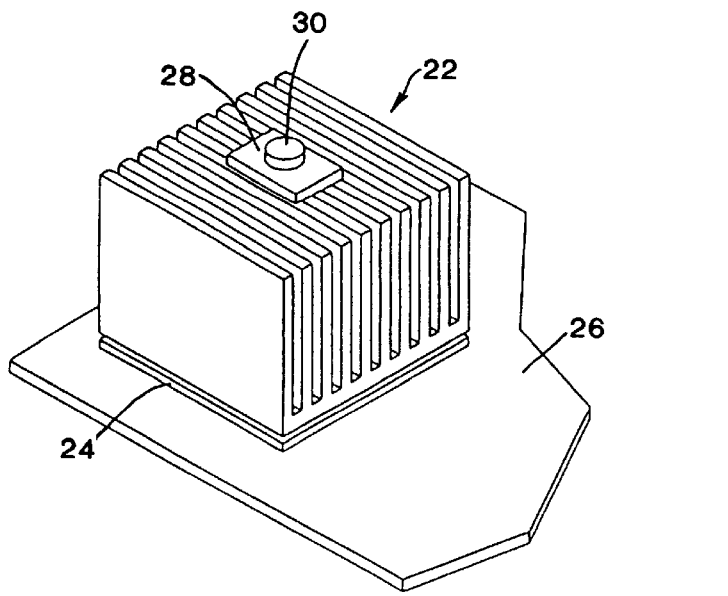
FIG. 1 is a prspective view of a heat sink in accordance with the present invention as mounted on a packaged integrated circuit which in turn is mounted on a printed circuit board 26.

First referring to FIG. 1, a heat sink, generally indicated by the numeral 22, is shown mounted on a packaged integrated circuit 24, which in turn is mounted on a printed circuit board 26. A typical installation of the type shown in FIG. 1 might comprise, by way of example, a ball grid array packaged integrated circuit mounted on the mother board of a computer system, with the heat sink 22 providing increased cooling to the integrated circuit by conducting heat from the integrated circuit to the heat sink 22, and passing the heat therefrom to the surrounding environment by convection, either free or forced convection. Also visible in FIG. 1 is a small plate-like member 28 at the top of the heat sink 22 through which a fastening device 30, such as a screw, passes.

As may be seen in FIG. 1, the heat sink 22 typically will have a footprint or area substantially equal to or even slightly larger than the area of the integrated circuit. While of course, smaller heat sinks could be used, the larger the heat sink, the more effective the cooling of the integrated circuit will be, and for integrated circuits which dissipate substantial power when operating, efficient dissipation of the heat generated is an important factor. The greater the heat dissipating capabilities of the heat sink, the lower the operating temperature of the integrated circuit will be, generally enhancing life and reliability of the integrated circuit. Further, in many instances, improved heat dissipating capabilities may make the difference between being able to use free convection cooling, as opposed to requiring forced convection cooling with its attendant cost, noise and limited life characteristics. Because of the size of the heat sink, however, the integrated circuit leads or contacts tend to be physically obscured by the heat sink, rendering conventional probing of the integrated circuit for troubleshooting purposes after the heat sink has been mounted on the integrated circuit extremely difficult at best, or frequently impossible. As such, troubleshooting may be stymied without removal of the heat sink because of the inability to adequately probe the integrated circuits on the printed circuit board to facilitate the identification of the faulty circuit and the replacement thereof.

Figure 2:
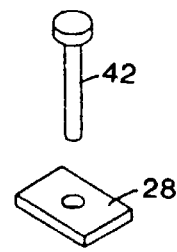
FIG. 2 is an exploded perspective view of the assembly of FIG. 1.
Figure 2:
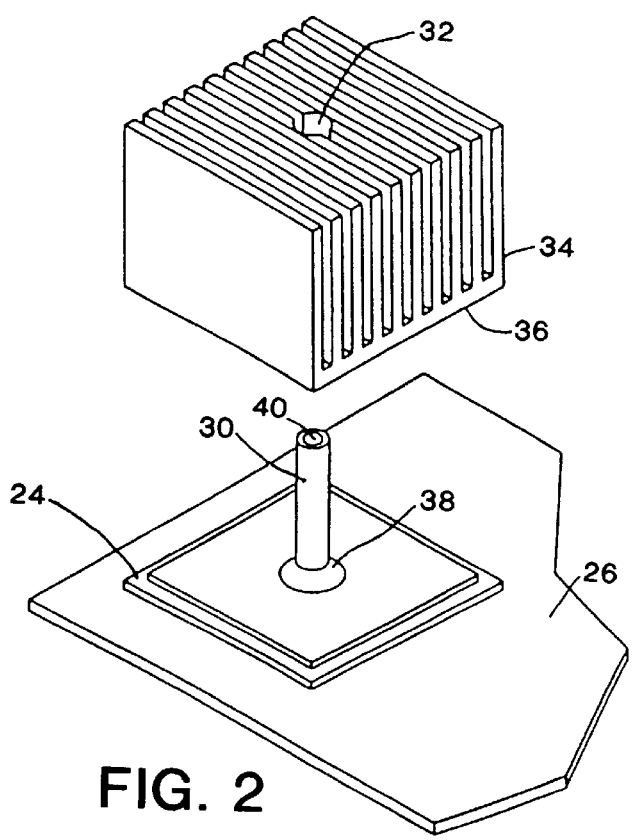

Now referring to FIG. 2, an exploded perspective view of the assembly of FIG. 1 may be seen. Integrated circuit 24, in a typical modern day application such as for processors and the like on the mother board of the computer system, and whether a ball grid array package or other well known package form, will typically be a relatively low profile package mounted substantially flush with the printed circuit board and having a flat top surface spanning most, if not all, of the plan form area of the packaged integrated circuit.

In the present invention, as may be seen in FIG. 2, a post 30 is provided having a relatively small cross-sectional area in comparison to the plan form area of the integrated circuit 24. The post 30 will fit within opening 32 passing through heat sink member 34 so that the heat sink member may be set over the post 30 so that the base 36 of the heat sink member lies flat against the upper flat surface of the integrated circuit 24. In the preferred embodiment, the post 30 is cemented to the top of the integrated circuit 24 by an epoxy or other appropriate cement, the specific embodiment disclosed utilizing a post having a flaring or flanged end 38 at the lower end thereof to provide increased area for adhesion of the post 30 to the integrated circuit 24. Of course the bottom surface 36 of the heat sink member 34 will be correspondingly countersunk, so that the flat portion of the bottom surface 36 of the heat sink member 34 will not be held away from the integrated circuit 24 by interference with the flaring or flange 38 on the post 30. Also in the preferred embodiment, the post 30 has a threaded hole 40 at the top end thereof for receiving a threaded member therein.

During production testing of the printed circuit board, artificial and extraordinary cooling means may be used to adequately cool the integrated circuits on the printed circuit board without the use of heat sinks, so that in the event a malfunction of the system on the printed circuit is detected, probing of the integrated circuits on the printed circuit board may readily be accomplished using standard techniques. Once the proper operation of the system has been confirmed, the heat sinks of the present invention may be installed on those integrated circuits which in operation dissipate a substantial amount of power, thereby needing enhanced heat dissipation when operating in the environment of the actual finished system (as opposed to an enhanced cooling environment which may be imposed solely for test purposes).

In installation, the posts 30 may be first cemented to the desired integrated circuit, preferably using centering and hold down fixtures to center the posts on the applicable integrated circuits and the maintain an accurate vertical orientation of the posts with respect to the top surface of the respective integrated circuits. In that regard, it is to be understood that the base of the posts may be flared out to provide an increased contact surface area for adhesion, or may extend over the entire area of the package integrated circuit, being cemented thereto with a heat conductive cement to provide good and permanent contact over the entire area, as shown in FIG. 2. Then, a heat sink member 34 is placed over each post, a washer-like member 28 is placed in position, and screw 42 is threaded into the threaded hole 40 of post 30 to hold the base or bottom 36 of heat sink member 34 in firm face-to-face abutment with the top surface of the integrated circuit 24. If desired, the bottom surface 36 of the heat sink member 34 and/or the top surface of the integrated circuit 24 or post base may be lightly coated with a heat conductive grease to increase the heat conduction between the integrated circuit and the heat sink member 34. Alternatively, the post and heat sink may be assembled together first, the then the assembly mounted on the integrated circuit.

The post 30 may be fabricated of substantially any material, such as by way of example plastics, though in the preferred embodiment a metal post such as an aluminum or copper post is used for structural integrity and enhanced heat transfer from the center of the integrated circuit 24 upward to the upper area of the heat sink member 34, and for less thermal mismatch. In that regard, because the center of an integrated circuit dissipating substantial power tends to run hotter than the edges of the circuit because of the lateral heat transfer away from the edges of the circuit, the enhanced heat transfer in the vertical direction by a highly heat conductive central post such as an aluminum post is beneficial.

The heat transfer member 34 in the embodiment shown may be readily fabricated as a section cut from an aluminum extrusion, though of course the same or heat transfer members of different designs may also be fabricated by die casting or by other fabrication methods. In that regard, the finned configuration shown in the exemplary embodiment of FIGS. 1 and 2 is directional with respect to forced convection, though this or other heat sink configurations well known in the prior art may be used for either forced or free convection cooling.

The post and its base are generally an integral part. However they are readily scalable to any size and shape, such as round or square, and may encompass the entire integrated circuit surface area depending on the size and mass of the heat sink to be mounted thereon.

The washer-like member 28 may be rectangular as shown, or alternatively a round washer-like member, as its function is to force the heat transfer member 34 into firm contact with the top of the integrated circuit 24 upon tightening of the screw 42. As an alternative, member 28 may be a spring member of predetermined spring force, with the screw 42 forcing the spring member to bottom on the top of the post 30. In this manner, a predetermined and repeatable force between the heat sink element 34 and the integrated circuit 24 is provided on each installation, preventing over tightening of the screw from forcing separation of the post 30 from the integrated circuit 24, or alternatively unnecessarily stressing the integrated circuit package.

One embodiment utilizing a spring hold-down may be seen in FIG. 3. Here spring 44 acts against the top of the heat sink, with mounting screw 46 on installation either bottoming against the post against the top of the heat sink. A similar embodiment is shown in FIG. 4, though in this embodiment, the spring 48 extends between the fins on the heat sink, limiting the height of the assembly to the height of the heat sink itself. The clearance for the post and screw may be provided by the normal separation of the fins on the heat sink, by deleting a fin or providing extra fin separation in that area, or by cutting a circular region in the fin center region of the heat sink as in the embodiment of FIGS. 1 and 2. Also in this embodiment, the spring is retained on the heat sink 50 by clips 52, reducing the number of small parts that need to be aligned at the time of installation.

Other alternate embodiments, of course, will be obvious to those skilled in the art. By way of example, the post 30 might be threaded on the outer diameter of its upper end, and a nut used to hold the assembly together, rather than screw 42. This is not preferred, however, as small screwdrivers tend to be more readily accessible and more easily manipulated than small wenches, though assembly of the post and heat sink prior to mounting on the integrated circuit would be more convenient. Also, if desired, an angular reference may be provided on the post 30 or base 38 of the post which operates with a complementary angular reference on the heat transfer member 34 to align the heat transfer member angularly with respect to the integrated circuit 24 so that the heat transfer member 34 cannot rotate with respect to the integrated circuit 24, either during tightening of the assembly or in the presence of vibration after the assembly is made. As shown in the further alternate embodiment of FIG. 5, the angular reference may also be provided by the use of two posts 54, the heat sink 56 having openings for the posts so as to positively align therewith.

There have been described herein heat sinks for integrated circuits of a removable character to allow removal of the heat sink to allow conventional probing of the integrated circuit for trouble shooting, should a circuit malfunction arise or be discovered after production testing of the circuit and the mounting of the heat sinks. While the present invention has been disclosed and described with respect to certain preferred embodiments thereof, it will be understood by those skilled in the art that various changes in form and detail may be made therein without departing from the spirit and scope of the invention.

What is claimed is:

1. A heat sink combination comprising:

a post for cementing to a semiconductor device;

a heat sink for fitting over the post so as to be in face-to-face relationship with the semiconductor device;

the post including a member for removably holding the heat sink over the post in face-to-face relationship with the semiconductor device.

2. The heat sink combination of claim 1 wherein the member for holding the heat sink in face-to-face relationship with the semiconductor device is a threaded member.

3. The heat sink combination of claim 1 wherein the heat sink is an aluminum member.

4. The heat sink combination of claim 1 wherein the heat sink is a finned aluminum extruded member.

5. The heat sink combination of claim 2 wherein the post is a metal member.

6. The improvement of claim 4 wherein the post removably holds the heat sink against the semiconductor device by a threaded member acting against a spring member between the threaded member and the heat sink.

7. The improvement of claim 6 wherein the heat sink is a finned member and the spring member acts on the top of fins on the heat sink.

8. The improvement of claim 6 wherein the heat sink is a finned member and the spring member acts on the heat sink in a region between fins on the heat sink.

9. The improvement of claim 6 wherein the post comprises a plurality of posts.

10. In a computer system, the improvement comprising;

a circuit board having a number of integrated circuits mounted thereon, at least one of the integrated circuits dissipating substantial power when operating;

a post cemented to the semiconductor device which dissipates substantial power when operating;

a heat sink fitting over the post so as to be in face-to-face relationship with the semiconductor device;

the post including a member removably holding the heat sink over the post in face-to-face relationship with the semiconductor device.

11. The improvement of claim 10 wherein the member holding the heat sink in face-to-face relationship with the semiconductor device is a threaded member.

12. The improvement of claim 10 wherein the post is a metal member.

13. The improvement of claim 10 wherein the heat sink is an aluminum member.

14. The improvement of claim 10 wherein the heat sink is a finned aluminum extruded member.

* * * * *

UNITED STATES PATENT AND TRADEMARK OFFICE
CERTIFICATE OF CORRECTION

PATENT NO. : 5,847,452
DATED : December 8, 1998
INVENTOR(S) : Tantoush It is certified that error appears in the above-identified patent and that said Letters Patent is hereby corrected as shown below:

In the title page, item [22], please delete " Filed: Jul. 1, 1997 " and insert
-- Filed: June 30, 1997 --.

Signed and Sealed this

Thirteenth Day of April, 1999

*Attest:*

Q. TODD DICKINSON

*Attesting Officer*   Acting Commissioner of Patents and Trademarks